(12) United States Patent
Furutono

(10) Patent No.: US 8,475,702 B2
(45) Date of Patent: Jul. 2, 2013

(54) IMPRINT DEVICE AND IMPRINT METHOD

(75) Inventor: Yohko Furutono, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 12/840,114

(22) Filed: Jul. 20, 2010

(65) Prior Publication Data
US 2011/0018173 A1 Jan. 27, 2011

(30) Foreign Application Priority Data

Jul. 21, 2009 (JP) ................................ 2009-170457

(51) Int. Cl.
*G01B 15/00* (2006.01)
(52) U.S. Cl.
USPC .......................................................... 264/406
(58) Field of Classification Search
USPC ........................................................ 264/406
See application file for complete search history.

(56) References Cited

FOREIGN PATENT DOCUMENTS

| JP | 2004-259985 | 9/2004 |
|---|---|---|
| JP | 2007-81048 | 3/2007 |
| JP | 2008-6638 | 1/2008 |

*Primary Examiner* — Larry Thrower
(74) *Attorney, Agent, or Firm* — Finnegan, Henderson, Farabow, Garrett & Dunner, LLP

(57) ABSTRACT

According to one embodiment, first image information of a mold is acquired by irradiating the mold with first light, the mold having an uneven pattern with a shape corresponding to a pattern to be transferred onto a substrate to be processed. The position of the uneven pattern of the mold is adjusted by applying stress to the mold. Second image information is acquired by irradiating the mold whose position is adjusted with the first light. Stress information of the mold whose position is adjusted is measured by comparing the first image information with the second image information. The position adjustment is repeated until the measurement result satisfies a desired condition, and a pattern is formed on the substrate by using the mold whose position is adjusted.

7 Claims, 10 Drawing Sheets

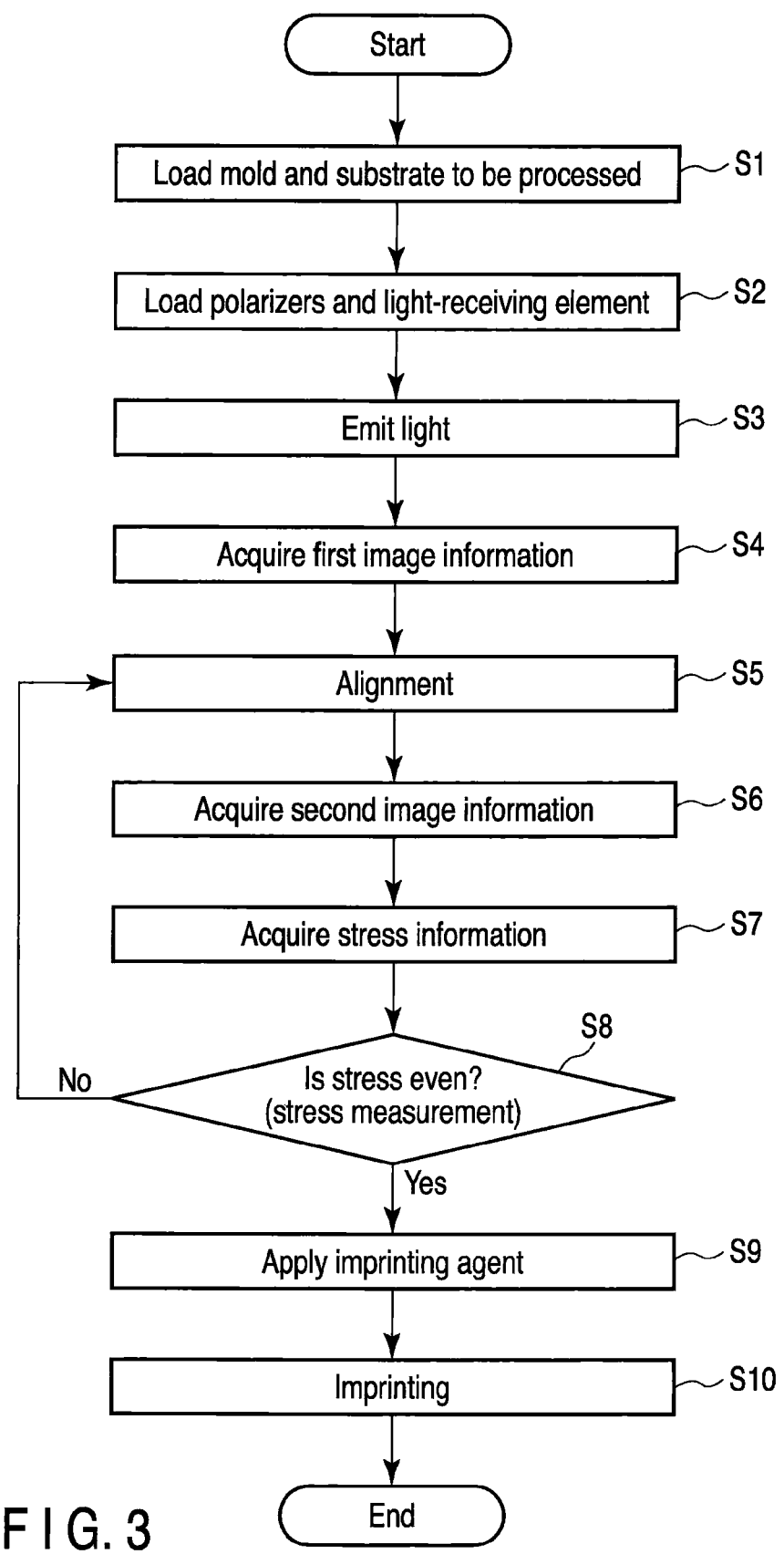
F I G. 3

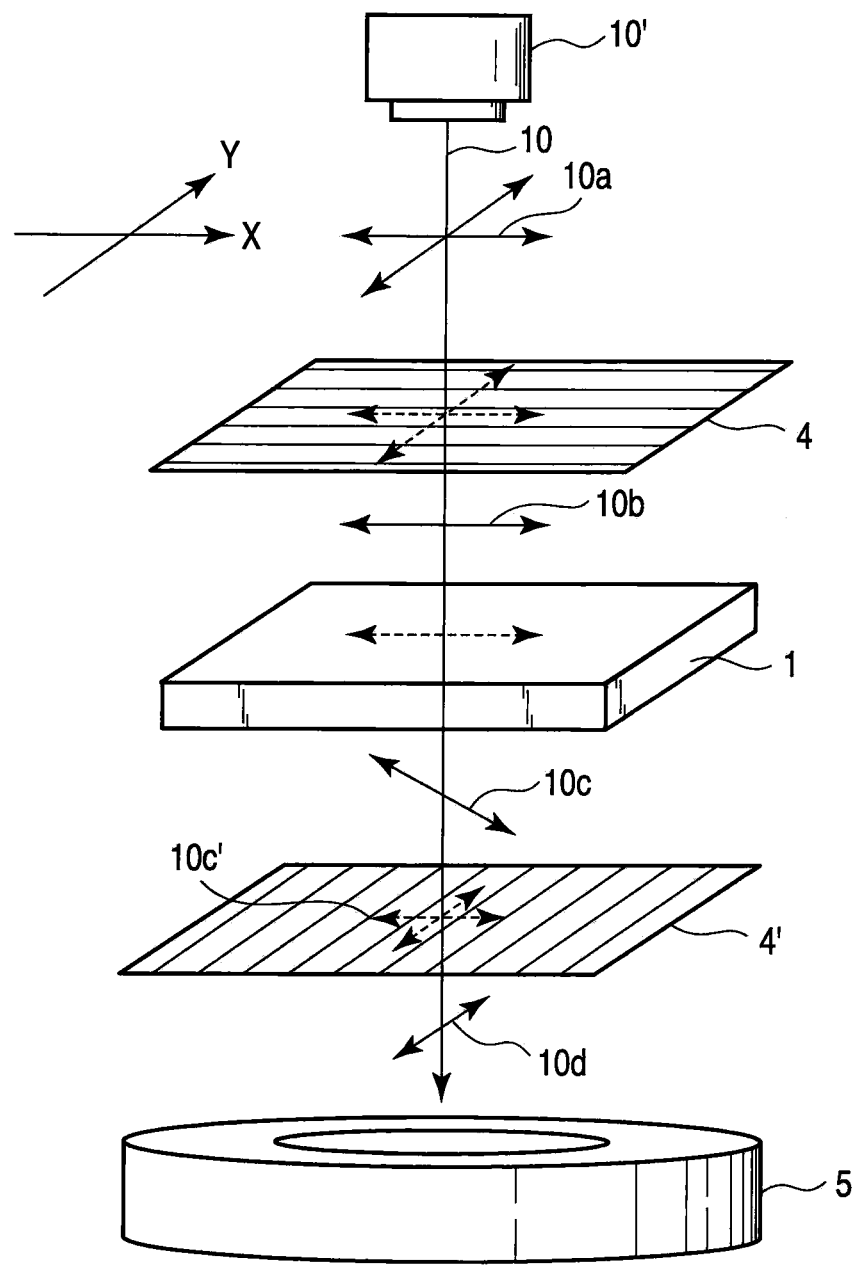
F I G. 4

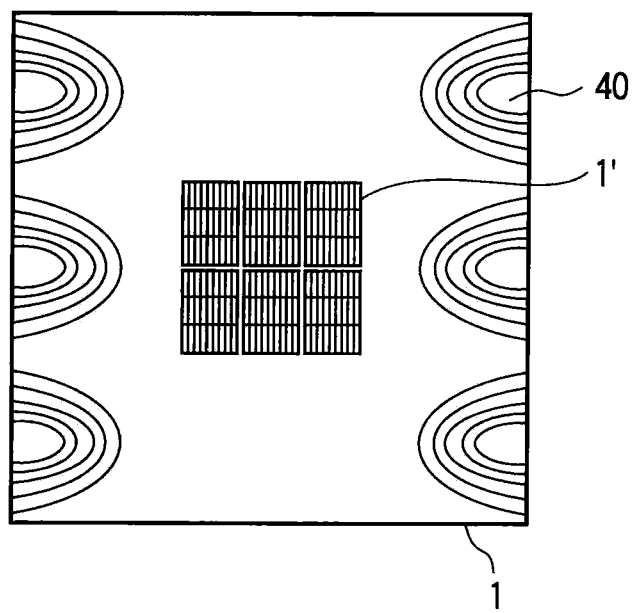
F I G. 5A
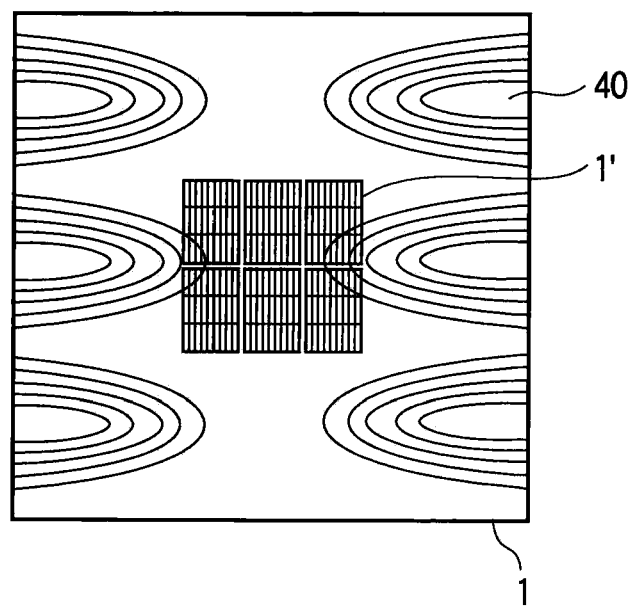
F I G. 5B

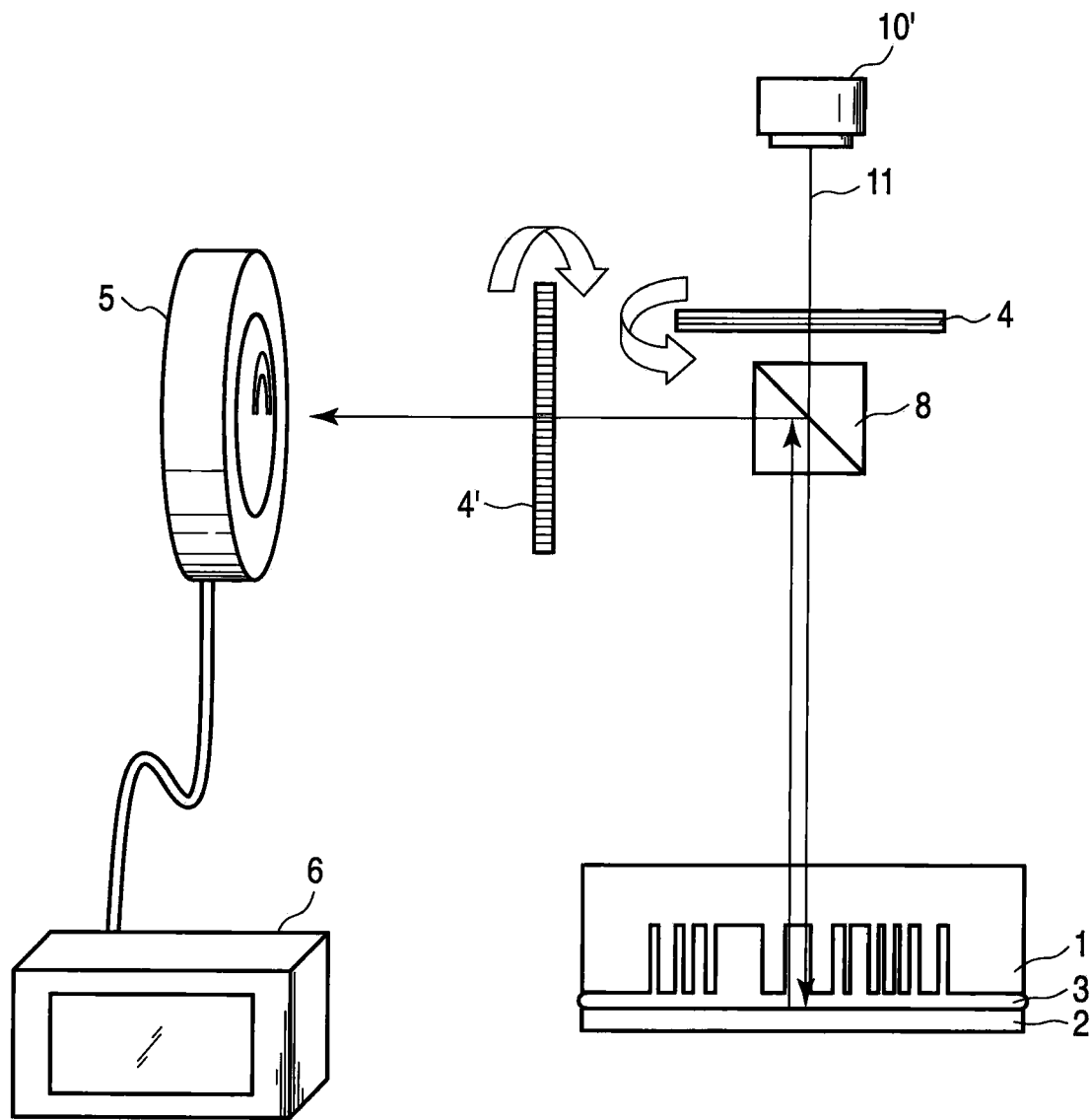
F I G. 7

IMPRINT DEVICE AND IMPRINT METHOD

CROSS-REFERENCE TO RELATED APPLICATIONS

This application is based upon and claims the benefit of priority from Japanese Patent Application No. 2009-170457, filed Jul. 21, 2009; the entire contents of which are incorporated herein by reference.

FIELD

Embodiments described herein relate generally to an imprint device for performing imprint lithography, and an imprint method using the device.

BACKGROUND

In the fabrication process of an advanced semiconductor product, the degree of micropatterning is increased by mainly increasing the resolution of an exposure apparatus. The resolution of an exposure apparatus is determined by the wavelength of exposure light and the numerical aperture (NA) of a projection lens. More specifically, it is known well, the shorter the wavelength and the higher the NA, the higher the resolution. Recently, deep ultraviolet light having a wavelength of 193 nm is used. Also, although a theoretically highest value of the NA in atmosphere is 1, an immersion exposure apparatus in which the NA is increased to 1.35 by filling water between a projection lens and a substrate to be processed has been put to practical use in order to obtain a higher NA. Presently, to meet demands for further increasing the degree of micropatterning, extreme ultraviolet (EUV) lithography using EUV light having a wavelength of 13.5 nm as a light source is being examined.

On the other hand, imprint lithography is attracting attention as one of the next micropattern formation techniques (e.g., Jpn. Pat. Appln. KOKAI Publication Nos. 2007-81048, 2004-259985, and 2008-6638). Imprint lithography is a micropattern formation method. In this method, a substrate to be processed is coated with a photocurable imprinting agent, and this imprinting agent is pressed against a transparent mold having a desired uneven pattern. In this state, the imprinting agent is cured by emitting light from the mold side, and the mold is separated, thereby forming a desired pattern on the substrate.

Optical imprint lithography includes the step of coating a substrate to be processed with a photocurable imprinting agent, the (alignment) step of aligning this substrate with a light-transmitting mold, the step of bringing the mold into contact with the photocurable imprinting agent, the step of curing the photocurable imprinting agent by light irradiation in this state, and the (separation) step of separating the mold from the cured photocurable imprinting agent (resist pattern).

In imprint lithography, the alignment is finely adjusted by shrinking (deforming) the pattern of a mold by applying a force to the side surfaces of the mold by using actuators. If the force is not evenly applied to the mold, the way the force is applied to the pattern of the mold changes from one place to another, and no intended pattern is obtained. In addition, since the force is applied to the mold, the mold deforms while imprinting is repeated, and this changes the way the force is transmitted. Accordingly, the force that is initially evenly applied to the mold pattern is biased to a certain region of the mold pattern. This limits the life of the mold to the time at which mold deformation is no longer allowable.

As described above, the force is applied to a mold in use. To increase the accuracy of alignment and detect the life of the mold, therefore, the internal stress of the mold must be measured. However, the internal stress of the mold is difficult to measure.

BRIEF DESCRIPTION OF THE DRAWINGS

FIG. 3 is a flowchart showing an imprint method according to the first embodiment;

FIG. 4 is a view for explaining the principle of polarizers according to the first embodiment;

FIGS. 5A and 5B are views showing an example of stress information of a mold according to the embodiment;

FIG. 7 is a view showing the imprint device according to the second embodiment, in which an operation state different from that shown in FIG. 6 is depicted;

DETAILED DESCRIPTION

In general, according to one embodiment, first image information of a mold is acquired by irradiating the mold with first light, the mold having an uneven pattern with a shape corresponding to a pattern to be transferred onto a substrate to be processed. The position of the uneven pattern of the mold is adjusted by applying stress to the mold. Second image information is acquired by irradiating the mold whose position is adjusted with the first light. Stress information of the mold whose position is adjusted is measured by comparing the first image information with the second image information. The position adjustment is repeated until the measurement result satisfies a desired condition, and a pattern is formed on the substrate by using the mold whose position is adjusted.

Embodiments will be explained below with reference to the accompanying drawing.

First Embodiment

The first embodiment is an example of an imprint device and imprint method of measuring the stress of a mold by transmitting light through it.

[Imprint Device]

Figure 1:
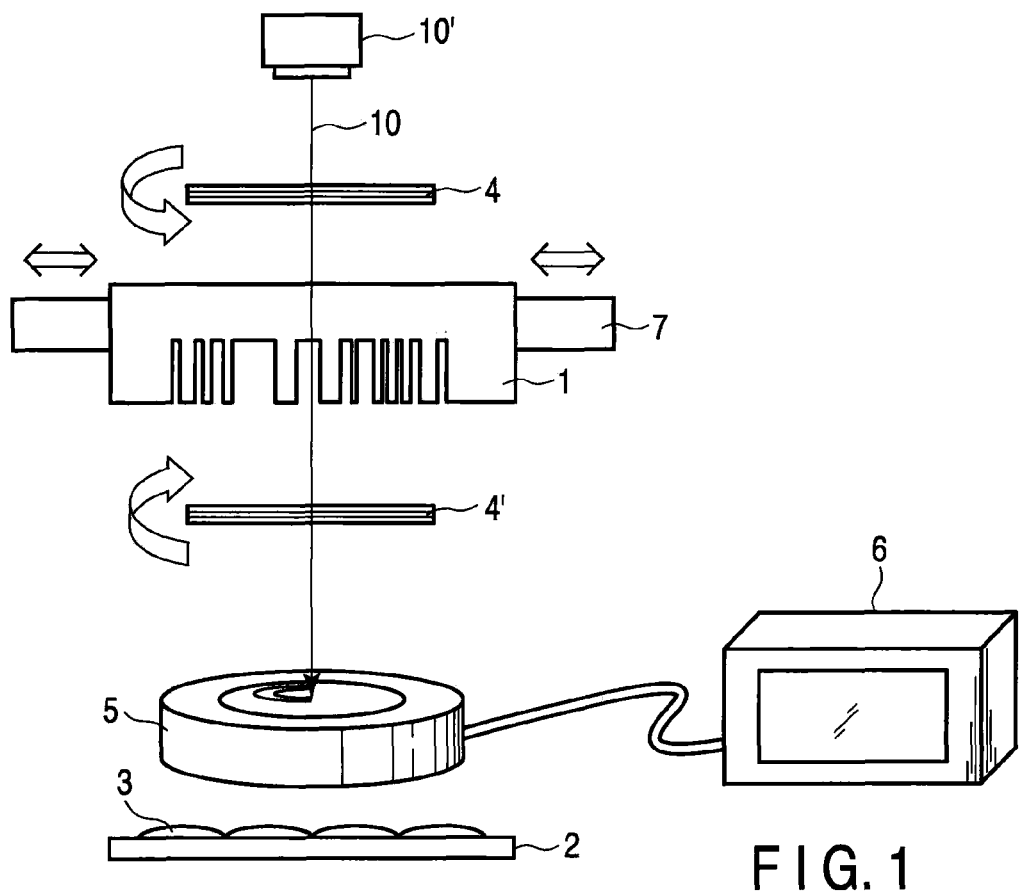
FIG. 1 is a view schematically showing the arrangement of an imprint device according to the first embodiment.

FIG. 1 schematically shows the arrangement of an imprint device according to this embodiment.

As shown in FIG. 1, the imprint device according to this embodiment includes polarizers 4 and 4', a light-receiving element 5, a monitor 6, actuators 7, and a light source 10'. A mold 1 and a substrate 2 to be processed are set in this imprint device. The surface of the substrate 2 is coated with an imprinting agent 3.

The mold 1 is set in the optical axis of the light source 10'. The polarizers 4 and 4' and light-receiving element 5 are inserted into the optical axis when measuring the stress of the mold 1, and removed from the optical axis after the measurement. When measuring the stress, the mold 1 is positioned between the polarizers 4 and 4', and the light-receiving element 5 receives light transmitted through the polarizer 4, mold 1, and polarizer 4'.

That is, light 10 emitted from the light source 10' is polarized through the polarizer 4. The light 10 polarized by the polarizer 4 is transmitted through the mold 1. The mold 1 has a uneven pattern corresponding to a pattern to be transferred onto the substrate 2, and is held by a mold holding member (not shown). The light 10 transmitted through the mold 1 is polarized through the polarizer 4'. The polarizers 4 and 4' are rotatable and can be fixed at arbitrary azimuth angles. The light-receiving element 5 receives the light 10 polarized by the polarizer 4'. The polarizer 4' and light-receiving element 5 are positioned between the mold 1 and substrate 2.

The light-receiving element 5 is, e.g., a sensor such as an image sensor in which photoelectric conversion cells are two-dimensionally arranged. The monitor 6 connected to the light-receiving element 5 performs image processing on the light 10 received by the light-receiving element 5, and displays the light 10 as an image. That is, the monitor 6 visualizes the light 10.

The actuators 7 are arranged on the side surfaces of the mold 1, and finely adjust the alignment of the mold 1. That is, the actuators 7 are piezoelectric elements or the like, and finely adjust the alignment by shrinking the mold 1 by applying pressure on the side surfaces of the mold 1.

The substrate 2 to be processed is set in a position corresponding to the uneven pattern of the mold 1. The surface of the substrate 2 is coated with the imprinting agent 3.

Figure 2:
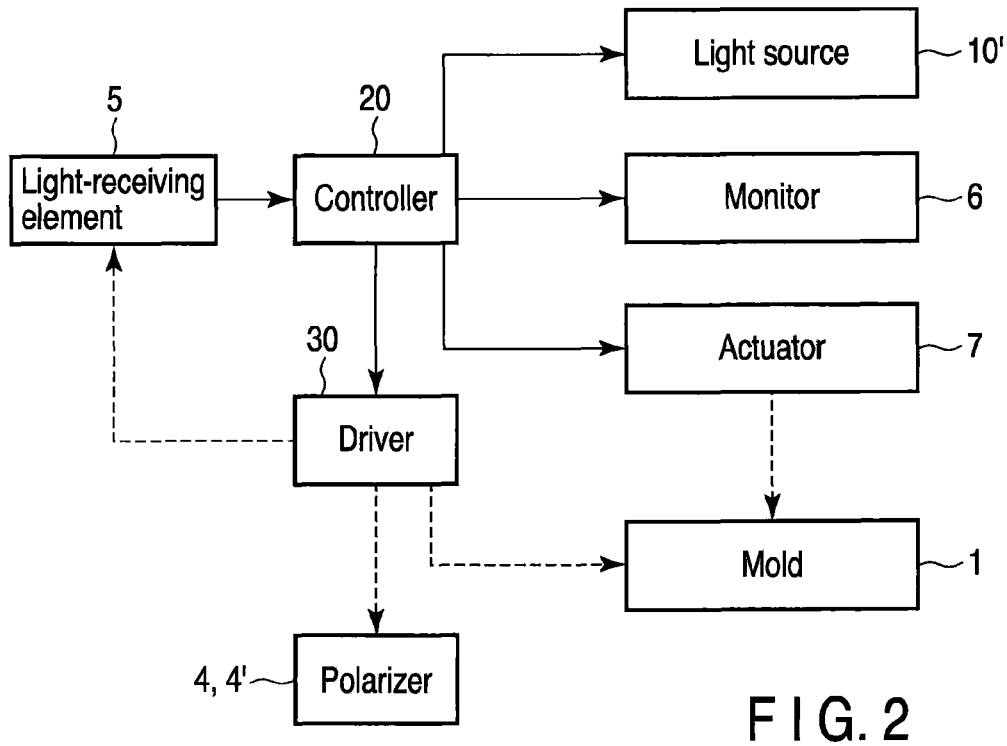
FIG. 2 is a block diagram showing the control system of the imprint device according to the first embodiment.

FIG. 2 is a block diagram of the control system of the imprint device according to this embodiment. Referring to FIG. 2, each solid-line arrow indicates the flow of an electrical signal, and each broken-line arrow indicates a mechanical force.

A controller 20 controls the operation of the whole imprint device. The controller 20 is connected to the light-receiving element 5, the light source 10', the monitor 6, the actuators 7, and a driver 30. The controller 20 controls the light source 10', monitor 6, actuators 7, and driver 30 in accordance with the light 10 received by the light-receiving element 5.

The light source 10' emits the light 10 by setting the emission direction, emission method, and emission time under the control of the controller 20.

The monitor 6 displays the image information of the mold 1 based on the light 10 received by the light-receiving element 5, under the control of the controller 20.

The actuators 7 finely adjust the alignment of the mold 1 under the control of the controller 20. That is, the actuators 7 finely adjust the alignment by shrinking the mold 1 by applying a pressure on, e.g., parallel side surfaces of the mold 1.

The driver 30 drives the mold 1, polarizers 4 and 4', and light-receiving element 5 under the control of the controller 20. The driver 30 inserts the polarizers 4 and 4' and light-receiving element 5 into the optical axis of the light source 10' when measuring the stress, and removes these components outside the optical axis after the measurement. Also, when performing imprinting, the driver 30 drives the mold 1 and brings it into contact with the imprinting agent.

[Imprint Method]

FIG. 3 is a flowchart showing an imprint method using the imprint device according to this embodiment. The imprint method using the imprint device according to this embodiment will be explained below with reference to FIG. 3.

First, the mold 1 is loaded into the imprint device and held by the mold holding member. Then, the substrate 2 to be processed is loaded into the imprint device and set in a position corresponding to the uneven pattern of the mold 1 (step S1).

Subsequently, the polarizers 4 and 4' and light-receiving element 5 are inserted into the imprint device as shown in FIG. 1 (step S2).

The light source 10' emits the light 10 (step S3). The light 10 can be light having a wavelength that cures the imprinting agent 3, or light having a wavelength that does not cure the imprinting agent 3. When the light 10 is light having a wavelength that cures the imprinting agent 3, the substrate 2 is desirably coated with the imprinting agent 3 after alignment (to be performed later) so that the imprinting agent 3 does not cure during the alignment. The light 10 passes through the polarizer 4, mold 1, and polarizer 4' from above, and is received by the light-receiving element 5. The polarizers 4 and 4' are rotated to match the azimuth angles so as to obtain an arbitrary brightness level.

Then, first image information of the mold 1 obtained by the light-receiving element 5 is displayed on the monitor 6, and stored in an internal memory (not shown) of the controller 20 (step S4). The first image information of the mold 1 is an image in a state in which no pressure is applied on the mold 1.

While the settings of the polarizers 4 and 4' are maintained, the polarizers 4 and 4' and light-receiving element 5 are removed from the imprint device, and the mold 1 is aligned with the substrate 2 (step S5). This alignment is performed based on, e.g., an alignment mark (not shown) indicating a reference position on the substrate 2. After that, the position of the uneven pattern is finely adjusted based on an underlying pattern formed on the substrate 2. This fine adjustment is performed by deforming the mold 1 by applying a force to, e.g., parallel side surfaces of the mold 1 by the actuators 7.

Then, the polarizers 4 and 4' and light-receiving element 5 are inserted into the imprint device again. The settings of the polarizers 4 and 4' are the same as those in step S4. In this state, the light 10 is emitted from the light source 10', and received by the light-receiving element 5 through the mold 1 on which the force is applied by the actuators 7. The light-receiving element 5 obtains second image information of the mold 1 on which the force is applied, and this second image information is displayed on the monitor 6 and stored in the memory (step S6).

Subsequently, stress information is obtained from the difference between the first image information stored in step S4 and the second image information acquired in step S6. That is, the controller 20 acquires the stress information of the mold 1 on which the force is applied by the actuators 7, by comparing the first and second image information (step S7).

Based on the stress information of the mold 1 obtained in step S7, stress measurement is performed to determine whether the stress is evenly applied on the uneven pattern inside the mold 1 (step S8). The principle of this stress measurement will be described later.

If the stress is biased to a portion of the uneven pattern of the mold 1 in step S8, the process returns to step S5. That is, the polarizers 4 and 4' and light-receiving element 5 are removed again, and the actuators 7 finely adjust the alignment of the mold 1. More specifically, the alignment is finely adjusted so as not to unevenly apply the stress on the uneven pattern.

If the stress is evenly applied on the uneven pattern of the mold 1 in step S8, the substrate 2 is coated with the imprinting agent 3 (step S9). Note that when the light 10 described above is light having a wavelength that does not cure the imprinting agent 3, the substrate 2 may also be coated with the imprinting agent 3 in step S1.

Then, the uneven pattern of the mold 1 is brought into contact with the imprinting agent 3. After that, light that cures the imprinting agent 3 is emitted while the imprinting agent 3 is filled in the uneven pattern (step S10).

The imprint method according to this embodiment is performed as described above.

[Principle of Stress Measurement]

FIGS. 4, 5A, and 5B illustrate the principle of the stress measurement in the imprint method according to this embodiment.

FIG. 4 shows the change in light passing through the polarizers in the imprint method according to this embodiment. Referring to FIG. 4, the polarizer 4 polarizes the light 10 in the X direction, and the polarizer 4' polarizes the light 10 in the Y direction.

As shown in FIG. 4, the light 10 emitted from the light source 10' is represented by components in two directions, i.e., the X and Y directions. Assume that the light 10 in this state is light 10a (e.g., X=5, Y=5, and light intensity $I=X^2+Y^2=50$). The light 10a first passes through the polarizer 4. Consequently, the light 10a is polarized in the X direction and changes into light 10b (e.g., X=5, Y=0, and I=25). The light 10b has the same magnitude as that of the X-direction component of the light 10a.

The light 10b then passes through the mold 1. Consequently, the light 10b is polarized in an arbitrary direction in accordance with the polarization characteristics of the mold 1, and changes into light 10c. The intensity I of the light 10c is the same as that of the light 10b. That is, the light 10c is represented as light 10c' (e.g., X=3, Y=4, and I=25) by components in two directions, i.e., the X and Y directions.

After that, the light 10c' passes through the polarizer 4'. Consequently, the light 10c' is polarized in the Y direction and changes into light 10d (e.g., X=0, Y=4, and I=16). The light 10d has the same magnitude as that of the Y-direction component of the light 10c'.

The light-receiving element 5 receives the light 10d transmitted through the polarizer 4'. The light 10d is light reflecting the polarization characteristics of the mold 1. That is, the light-receiving element 5 can acquire the image information of the mold 1 by performing image processing on the received light 10d by the intensity I of the light 10d. Note that the azimuth angles of the polarizers 4 and 4' are not limited to the vertical direction, and are appropriately adjusted in accordance with the polarization characteristics of the mold 1 in order to allow the light-receiving element 5 to readily perform the image processing on the intensity I of the light 10d.

Since the polarizers 4 and 4' are used, the first image information of the mold 1 on which no pressure is applied can be acquired in step S4, and the second image information of the mold 1 on which pressure is applied can be acquired in step S6. When pressure is applied on the mold 1, stress birefringence occurs in the mold 1. When acquiring the image information by transmitting the light 10 through the mold 1, therefore, the first image information of the mold 1 on which no pressure is applied differs from the second image information of the mold 1 on which pressure is applied. Based on this difference between the first and second image information, the stress information of the mold 1 on which pressure is applied is acquired in step S7.

FIGS. 5A and 5B depict an example of the stress information of the mold 1 in the imprint method according to this embodiment.

As shown in FIGS. 5A and 5B, a uneven pattern 1' is formed in the center of the mold 1. Interference fringes 40 corresponding to the stress are formed in the end portions of the mold 1 because the actuators (not shown) apply pressure during the fine adjustment of the alignment. FIGS. 5A and 5B illustrate an example in which three actuators are arranged on each of two parallel side surfaces of the mold 1, and a total of six actuators finely adjust the alignment.

FIG. 5A shows a state in which the stress is evenly applied on the uneven pattern 1' of the mold 1 by the fine adjustment of the alignment during the stress measurement in step S8. FIG. 5B shows a state in which the stress generated by the fine adjustment of the alignment is unevenly applied to a portion of the uneven pattern 1' of the mold 1. When the stress is unevenly applied to a portion of the uneven pattern 1' as described above, the actuators finely adjust the alignment again (step S5). In this fine adjustment, the controller 20 controls the actuators so as to eliminate the difference between portions of the uneven pattern 1' of the mold 1, or evenly change the whole uneven pattern 1' even if there is a difference between portions of the uneven pattern 1', based on the first and second image information. That is, the controller 20 controls the actuators so as not to produce the interference fringes 40 in the uneven pattern 1'. On the other hand, when the stress is evenly applied on the uneven pattern 1', the imprinting steps (steps S9 and S10) are performed.

The principle of the stress measurement described above is applicable to each embodiment (to be described later) as well.

[Effects]

In the first embodiment described above, the first image information of the mold 1 on which no pressure is applied and the second image information of the mold 1 on which pressure is applied during alignment are acquired by detecting the light 10 transmitted through the mold 1 by using the polarizers 4 and 4' and light-receiving element 5. The stress applied on the mold 1 during alignment can be measured by comparing these pieces of image information. Therefore, the alignment can be adjusted so as not to bias the force in the surface of the uneven pattern of the mold 1. This makes it possible to increase the alignment accuracy.

Also, even when fine adjustment is performed while evenly applying a force on the uneven pattern of the mold 1, the uneven pattern deforms while imprinting is repeated. This limits the life of the mold to the time at which mold deformation is no longer allowable. In this embodiment, however, the alignment is performed while measuring the stress of the deformed mold 1. Accordingly, highly accurate patterns can be formed even when using the deformed mold 1. This makes it possible to prolong the life of the mold 1.

Second Embodiment

In the first embodiment, the polarizer 4' and light-receiving element 5 are directly set in the optical axis of light from the light source 10'. In the second embodiment, however, a polarizer and light-receiving element are set in the optical axis of reflected light from a mold or a substrate to be processed. That is, the second embodiment is an example of an imprint device and imprint method of measuring the stress of a mold and the stress of a curing imprinting agent, by perpendicularly emitting light toward the mold and imprinting agent and receiving the reflected light from them. Note that in the second embodiment, an explanation of the same features as in the above-mentioned first embodiment will be omitted, and differences will be explained in detail.

[Imprint Device]

Figure 6:
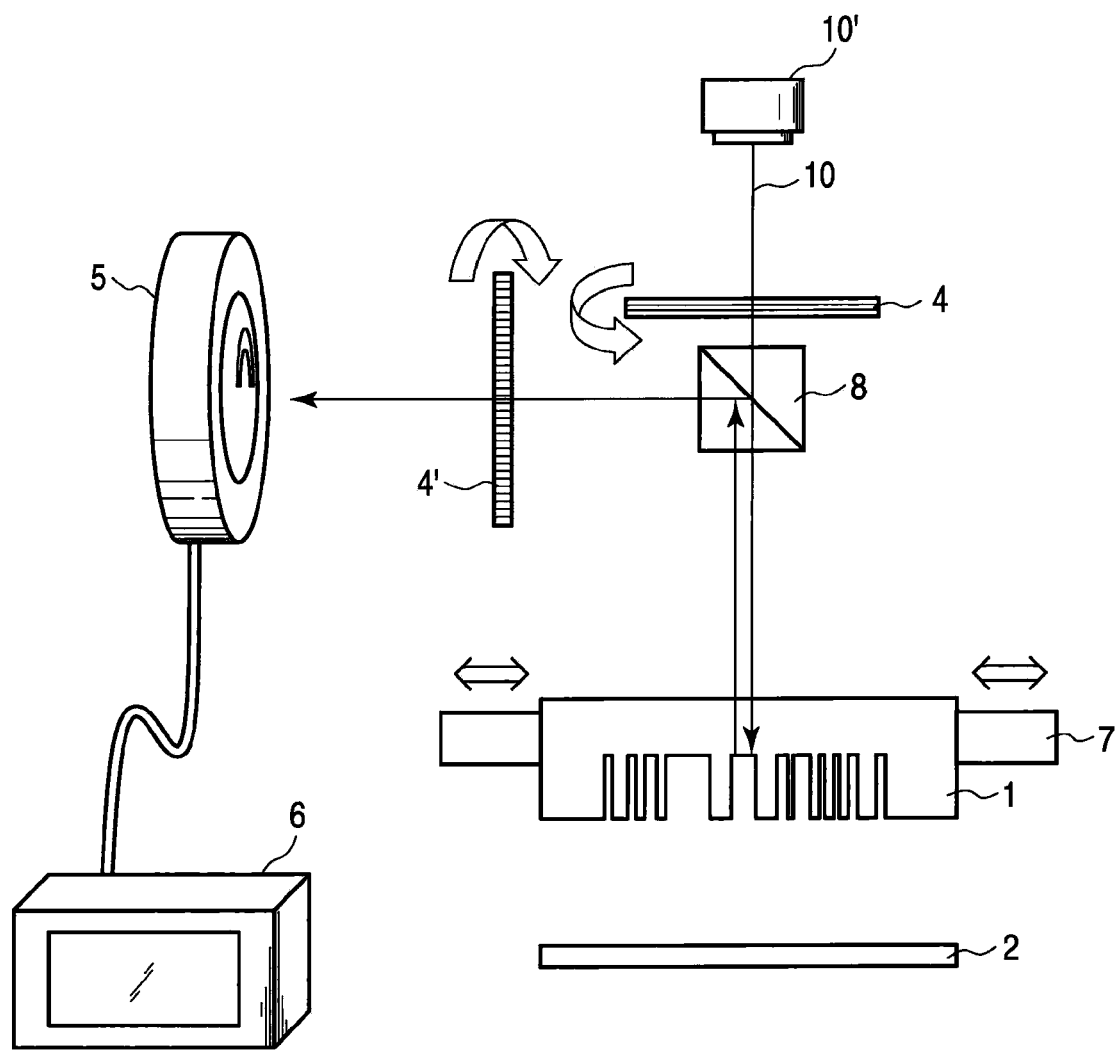
FIG. 6 is a view schematically showing the arrangement of an imprint device according to the second embodiment.

FIGS. 6 and 7 schematically illustrate the arrangement of an imprint device according to this embodiment. FIG. 6 shows the measurement of the stress of a mold during alignment. FIG. 7 shows the measurement of the stress of an imprinting agent during imprinting.

As shown in FIGS. 6 and 7, a beam splitter 8 is installed between a polarizer 4 and mold 1 in the imprint device according to this embodiment. A polarizer 4' and light-receiving element 5 are installed on the side of the beam splitter 8. Accordingly, neither the polarizer 4' nor the light-receiving element 5 exists between the mold 1 and a substrate 2 to be processed. A driver 30 shown in FIG. 2 drives the polarizers 4 and 4', light-receiving element 5, and beam splitter 8.

The beam splitter 8 transmits light 10 emitted from a light source 10' and passed through the polarizer 4. The light 10 transmitted through the beam splitter 8 perpendicularly enters the mold 1 or an imprinting agent 3. The beam splitter 8 reflects the light 10 reflected by the mold 1 or imprinting agent 3. The light 10 reflected by the beam splitter 8 is received by the light-receiving element 5 through the polarizer 4'.

[Imprint Method]

Figure 8:
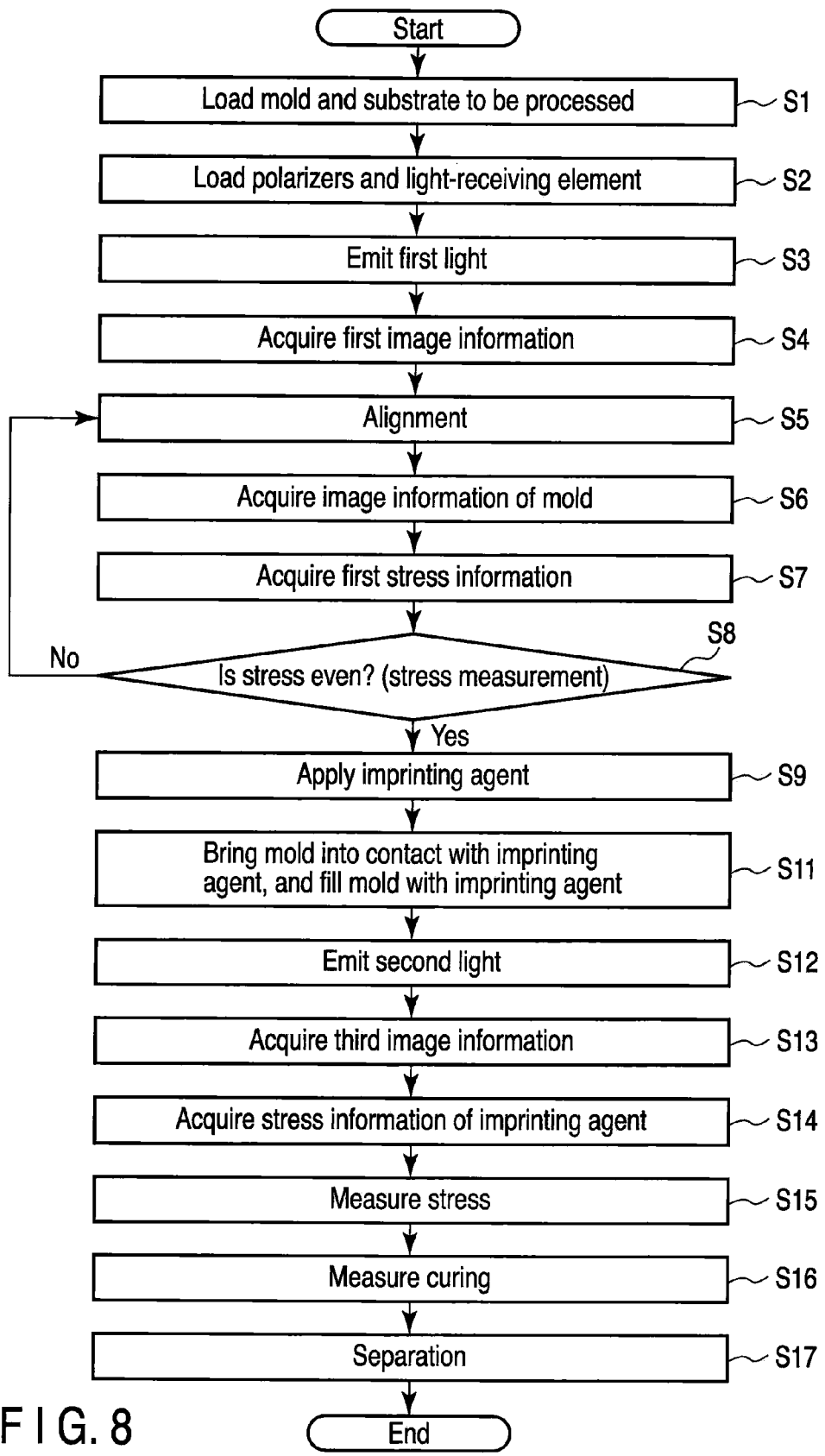
FIG. 8 is a flowchart showing an imprint method according to the second embodiment.

FIG. 8 is a flowchart showing an imprint method using the imprint device according to this embodiment.

[Measurement of Mold Stress]

The measurement of the stress of the mold 1 shown in FIG. 6 will be explained below with reference to FIG. 8.

First, the mold 1 and the substrate 2 to be processed are loaded into in the imprint device (step S1). The mold 1 is set above and apart from the substrate 2.

Then, the polarizers 4 and 4', light-receiving element 5, and beam splitter 8 are inserted into the positions shown in FIG. 6 (step S2).

Subsequently, the light source 10' emits first light 10 (step S3). The first light 10 can be light having a wavelength that cures the imprinting agent 3, or light having a wavelength that does not cure the imprinting agent 3. The first light 10 passes through the polarizer 4 and beam splitter 8, and is reflected by the mold 1. The first light 10 reflected by the mold 1 is reflected by the beam splitter 8, and received by the light-receiving element 5 through the polarizer 4'. First image information of the mold 1 is obtained from the first light 10 received by the light-receiving element 5. The first image information is displayed on a monitor 6, and stored in a memory (step S4).

Then, the mold 1 is aligned with the substrate 2 (step S5). That is, actuators apply a force on the side surfaces of the mold 1. In this embodiment, neither the polarizer 4' nor the light-receiving element 5 exists as an obstacle between the mold 1 and substrate 2. This obviates the need to remove these components outside the optical axis unlike in the first embodiment.

After that, the light source 10' emits the first light 10 to the mold 1 on which the force is applied. The first light 10 reflected by the mold 1 is received by the light-receiving element 5 through the polarizer 4', and second image information of the mold 1 is obtained. The second image information is displayed on the monitor 6, and stored in the memory (step S6).

As in the first embodiment, stress information of the mold 1 on which the force is applied by the actuators is acquired by comparing the first and second image information (step S7).

Based on the stress information of the mold 1 obtained in step S7, stress measurement is performed to determine whether the stress is evenly applied on a uneven pattern inside the mold 1 (step S8).

If the stress is unevenly applied on a portion of the uneven pattern of the mold 1 in step S8, the process returns to step S5. Consequently, the actuators perform fine adjustment so as not to unevenly apply the stress on the uneven pattern.

If the stress is evenly applied on the uneven pattern of the mold 1 in step S8, the stress measurement of the mold 1 is completed, and the substrate 2 is coated with the imprinting agent 3 (step S9). Note that when the above mentioned light 10 is light having a wavelength that does not cure the imprinting agent 3, the substrate 2 may also be coated with the imprinting agent 3 in step S1.

[Measurement of Stress of Imprinting Agent]

Imprinting is executed after the stress measurement of the mold 1 is complete as described above. The stress measurement of the imprinting agent 3 shown in FIG. 7 will be explained below with reference to FIG. 8.

First, the mold 1 is moved to bring the uneven pattern of the mold 1 into contact with the imprinting agent 3. In this state, the imprinting agent 3 is filled in the uneven pattern (step S11). Since the imprinting agent 3 is a liquid, no stress is generated on the imprinting agent 3.

Then, second light 11 is emitted from above (step S12). The second light 11 is light having a wavelength that cures the imprinting agent 3. Consequently, the imprinting agent 3 starts curing, and the stress of the imprinting agent 3 starts changing.

Subsequently, the light-receiving element 5 acquires third image information of the imprinting agent 3 from the second light 11 reflected by the curing imprinting agent 3, and the monitor 6 displays the information (step S13). The monitor 6 continuously displays the third image information while the imprinting agent 3 is curing.

Based on the third image information, stress information of the curing imprinting agent 3 is acquired (step S14). The stress information of the curing imprinting agent 3 is continuously acquired by continuously acquiring the third image information. That is, the light-receiving element 5 continuously receives the reflected light from the imprinting agent 3, and continuously outputs the third image information at, e.g., a predetermined timing.

Based on the change in continuously acquired stress information of the imprinting agent 3, the stress of the imprinting agent 3 is measured (step S15). Those portions of the imprinting agent 3 which hardly cure and easily cure depending on the uneven pattern and time are discriminated based on the change in continuously acquired stress information of the imprinting agent 3. That is, a portion where the stress change rate is high is an easily curable portion, and a portion where the change rate is low is a hardly curable portion. Based on the discrimination results, it is possible to determine the emission conditions of the second light 11 when curing the imprinting agent 3 for the second time and after that. That is, when it is possible to change the emission direction, emission method, and emission time of the second light 11, the emission time of the second light 11 can be shortened for the easily curable portion of the imprinting agent 3, and prolonged for the hardly curable portion of the imprinting agent 3. This makes it possible to shorten the curing time of the imprinting agent 3.

The stress measurement of the imprinting agent 3 in step S15 is continued to check the curing completion state of the imprinting agent 3 (step S16). The curing of the imprinting agent 3 can be checked by continuously acquired stress information shown in FIGS. 9A, 9B, and 9C.

Figure 9A:
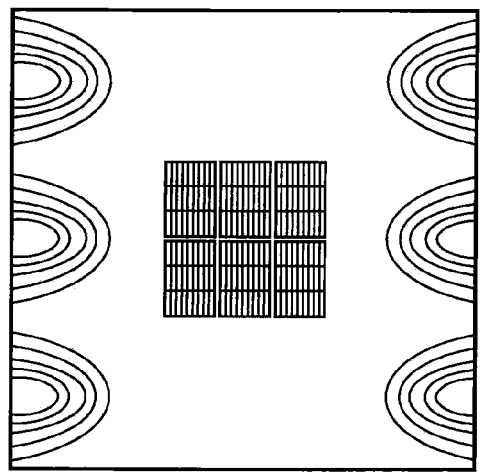
FIGS. 9A, 9B, and 9C are views showing an example of stress information of a mold and imprinting agent according to the embodiment.
Figure 9B:
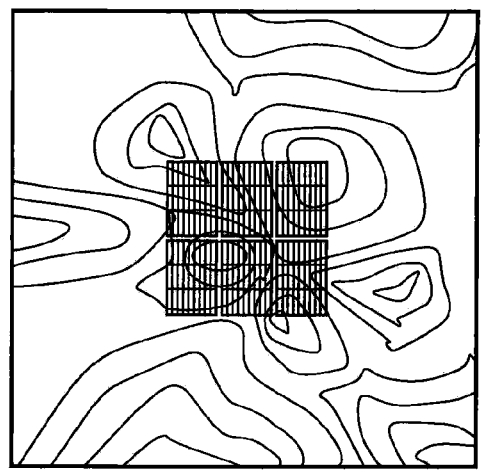
Figure 9C:
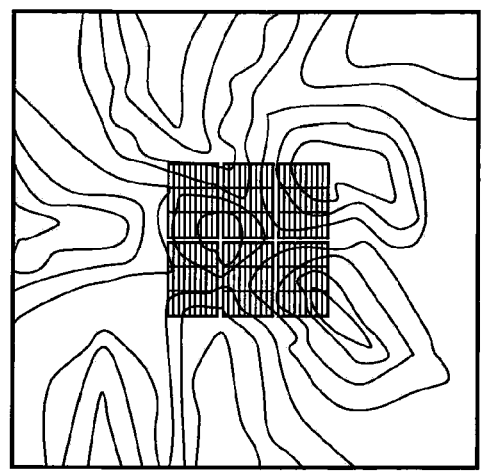

FIG. 9A shows an example of the stress information of the uncured imprinting agent 3 and the mold 1. FIG. 9B shows an example of the stress information of the curing imprinting agent 3 and the mold 1. This stress information (the state of interference fringes) is abruptly changing. FIG. 9C shows an example of the stress information of the cured imprinting agent 3 and the mold 1. Based on this change in stress information, the curing state of the imprinting agent 3 can be measured. The curing completion of the imprinting agent 3 can be detected based on the measured curing state. For example, when the change rate of the stress information has become lower than a predetermined value and stabilized, it is possible to determine that the curing of the imprinting agent 3 is complete.

[Effects]

In the second embodiment described above, the polarizer 4' and the light-receiving element 5 that receives the reflected light from the mold 1 and the substrate 2 to be processed can be arranged on the side of the light source 10' with respect to the mold 1, because the beam splitter 8 is used. This makes it possible to measure the stress of the mold 1 during alignment without moving the polarizers 4 and 4' and light-receiving element 5. Accordingly, the same effects as those of the first embodiment can be obtained.

Also, neither the polarizer 4' nor the light-receiving element 5 exists between the mold 1 and substrate 2. After the mold 1 and imprinting agent 3 are brought into contact with each other, therefore, the third image information of the curing imprinting agent 3 can continuously be acquired by detecting the second light 11 reflected by the third imprinting agent 3. This makes it possible to measure the stress of the curing imprinting agent 3. Accordingly, it is possible to discriminate between those portions of the imprinting agent 3 which easily cure and hardly cure depending on the uneven pattern and time, and determine the emission conditions such as the emission direction, emission method, and emission time when curing the imprinting agent 3 for the second time and after that.

Furthermore, the curing completion timing of the imprinting agent 3 can be detected by continuously acquiring the stress information of the curing imprinting agent 3, and observing the way the stress information of the imprinting agent 3 changes. Therefore, it is possible to avoid excessive light emission, increase the imprinting accuracy, and shorten the processing time.

Third Embodiment

The third embodiment is a modification of the second embodiment, and differs from the second embodiment in light emission angle with respect to a mold and a substrate to be processed when measuring the stress of the mold and the stress of a curing imprinting agent.

[Imprint Device]

Figure 10:
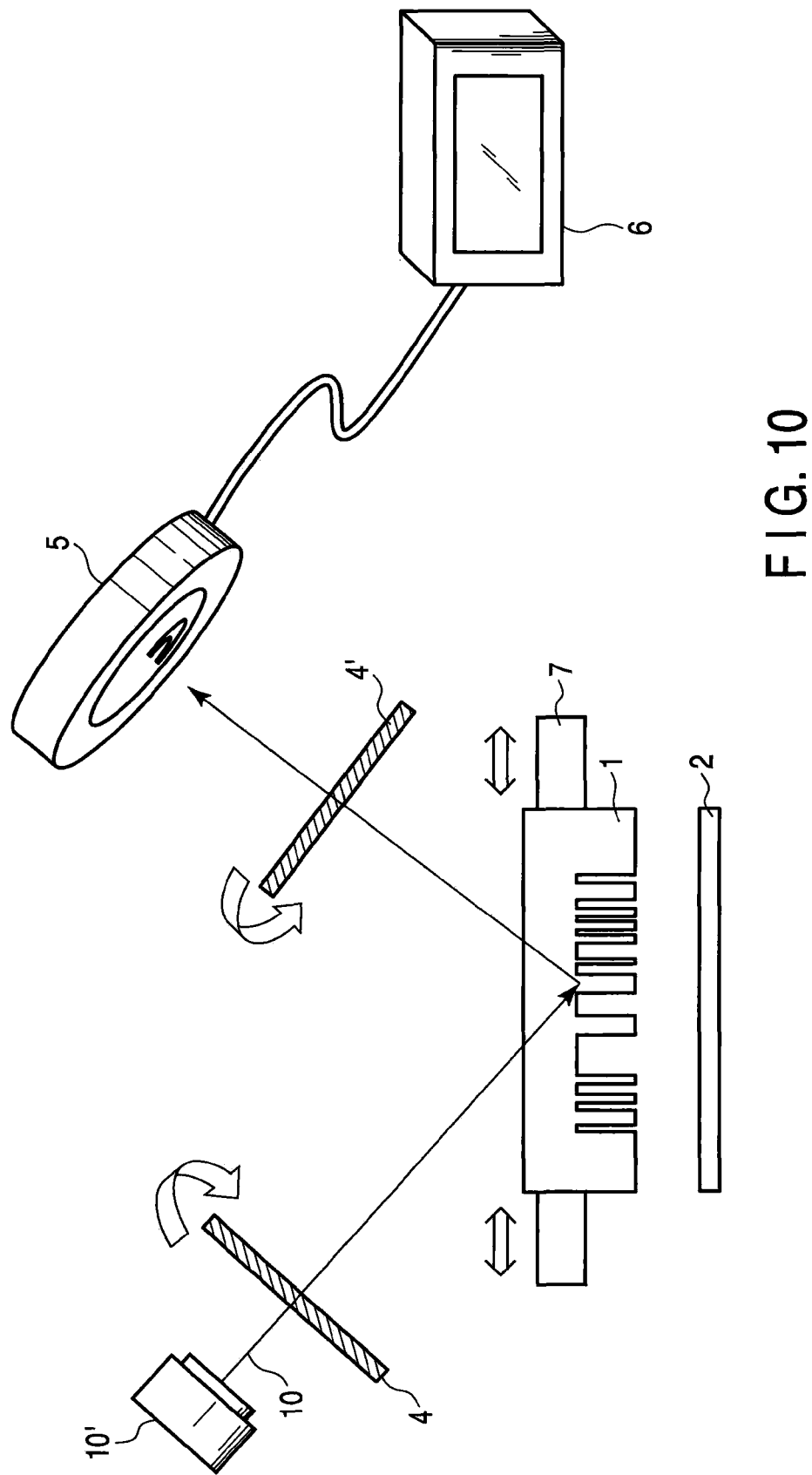
FIG. 10 is a view schematically showing the arrangement of an imprint device according to the third embodiment.
Figure 11:
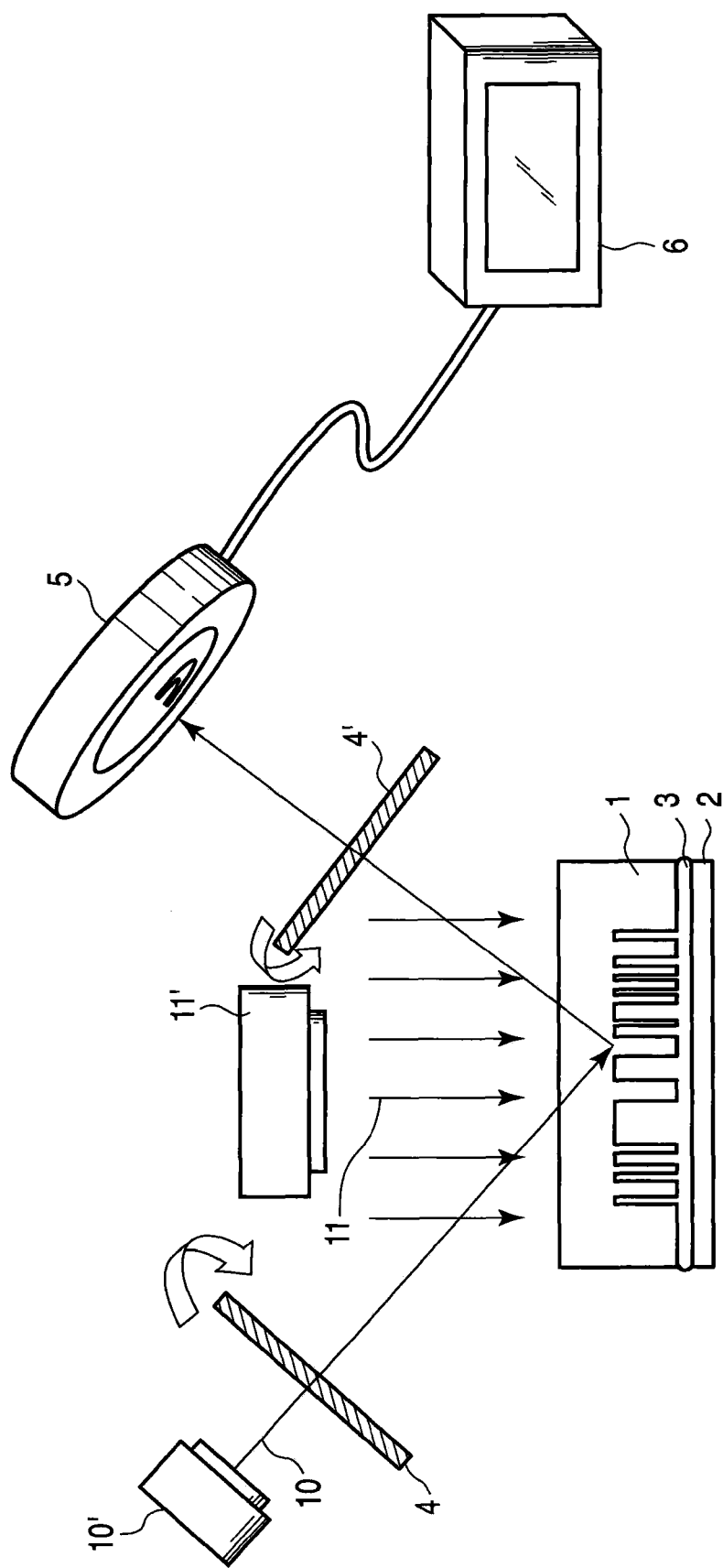
FIG. 11 is a view showing the imprint device according to the third embodiment, in which an operation state different from that shown in FIG. 10 is depicted.

FIGS. 10 and 11 schematically depict the arrangement of an imprint device according to the third embodiment. FIG. 10 shows the measurement of the mold stress during alignment. FIG. 11 shows the measurement of the stress of an imprinting agent during imprinting.

As shown in FIGS. 10 and 11, when performing alignment, a light source 10' and polarizer 4 are arranged in positions inclined, e.g., 45° with respect to a line (normal line) perpendicular to a mold 1, and a polarizer 4' and light-receiving element 5 are arranged to be symmetrical to the light source 10' and polarizer 4 with respect to the normal line. Also, a light source 11' is positioned on the normal line during imprinting. In the imprint device according to this embodiment as described above, light 10 having a wavelength that does not cure an imprinting agent and light 11 that cures the imprinting agent enter the mold 1 and an imprinting agent 3 in different directions.

The light 10 emitted from the light source 10' is light having a wavelength that does not cure the imprinting agent 3. The light 10 passes through the polarizer 4, and enters the mold 1 or imprinting agent 3.

The light 10 reflected by the mold 1 or imprinting agent 3 is received by the light-receiving element 5 through the polarizer 4'.

As shown in FIG. 11, when measuring the stress of the imprinting agent 3, the light source 11' emits the light 11 simultaneously with the light 10. The light 11 emitted from the light source 11' is light having a wavelength that cures the imprinting agent 3. The light 11 perpendicularly enters the mold 1 or imprinting agent 3.

[Imprint Method]

An imprint method according to this embodiment measures the stress of the mold 1 and the stress of the imprinting agent 3 in the same manner as in the second embodiment.

The imprint method according to this embodiment differs from the second embodiment in that when measuring the stress of the imprinting agent 3, the first light 10 and second light 11 enter the mold 1 and imprinting agent 3 in different directions. That is, the second light 11 perpendicularly enters the imprinting agent 3 and cures it, and the first light 10 enters the imprinting agent 3 in a different direction at the same time, thereby acquiring image information of the curing imprinting agent 3.

[Effects]

In the third embodiment described above, the light source 10' and polarizer 4 are arranged to be symmetrical to the polarizer 4' and light-receiving element 5 with respect to the normal line perpendicular to the surface of the mold 1. Therefore, the light-receiving element 5 can receive the reflected light from the mold 1 and imprinting agent 3 without using the beam splitter 8 unlike in the second embodiment. Consequently, the same effects as those of the second embodiment can be obtained.

In addition, this embodiment can reduce the cost of the imprint device because the beam splitter 8 is unnecessary.

Furthermore, the second light 11 for curing the imprinting agent 3 perpendicularly directly enters the mold 1 and imprinting agent 3 without passing through any transmitting material. Since the second light 11 enters the imprinting agent 3 without decreasing the intensity, the curing rate can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method comprising:
  acquiring first image information of a mold by irradiating the mold with first light and receiving the first light reflecting a polarization characteristic of the mold, the mold having an uneven pattern with a shape corresponding to a pattern to be transferred onto a substrate to be processed;

adjusting a position of the uneven pattern of the mold by applying stress to the mold;

acquiring second image information by irradiating the mold whose position is adjusted with the first light and receiving the first light reflecting a polarization characteristic of the mold whose position is adjusted;

measuring stress information of the mold whose position is adjusted, by comparing the first image information with the second image information; and repeating the position adjustment until the measurement result satisfies a desired condition, and forming a pattern on the substrate by using the mold whose position is adjusted.

2. The method according to claim 1, further comprising:

bringing the mold whose position is adjusted into contact with an imprinting agent applied on the substrate;

irradiating the imprinting agent with second light which cures the imprinting agent;

continuously acquiring third image information of the curing imprinting agent by receiving the second light reflected by the imprinting agent; and measuring stress information of the imprinting agent by the third image information.

3. The method according to claim 2, further comprising measuring a curing state of the imprinting agent based on a change in measured stress information of the imprinting agent.

4. The method according to claim 3, further comprising determining, based on the curing state, an irradiation condition of the second light when the imprinting agent is cured from the second time.

5. The method according to claim 1, wherein the first image information is acquired by receiving the first light transmitted through the mold, and the second image information is acquired by receiving the first light transmitted through the mold whose position is adjusted.

6. The method according to claim 1, wherein the first image information is acquired by receiving the first light reflected by the mold, and the second image information is acquired by receiving the first light reflected by the mold whose position is adjusted.

7. The method according to claim 1, wherein when the position adjustment is repeated until the measurement result satisfies the desired condition, and the pattern is formed on the substrate by using the mold whose position is adjusted, if stress is not evenly applied on the uneven pattern of the mold, the position adjustment is repeated, and if stress is evenly applied on the uneven pattern of the mold, the pattern is formed on the substrate by using the mold whose position is adjusted.

* * * * *